United States Patent
Sun et al.

(10) Patent No.: US 11,646,705 B2
(45) Date of Patent: May 9, 2023

(54) DUAL-MODE POWER AMPLIFIER FOR WIRELESS COMMUNICATION

(71) Applicant: Silicon Laboratories Inc., Austin, TX (US)

(72) Inventors: Ruifeng Sun, Charlottesville, VA (US); Sherry Wu, Austin, TX (US); Michael S. Johnson, Austin, TX (US); Vitor Pereira, Austin, TX (US)

(73) Assignee: Silicon Laboratories Inc., Austin, TX (US)

( * ) Notice: Subject to any disclaimer, the term of this patent is extended or adjusted under 35 U.S.C. 154(b) by 0 days.

(21) Appl. No.: 17/363,049

(22) Filed: Jun. 30, 2021

(65) Prior Publication Data

US 2023/0006621 A1    Jan. 5, 2023

(51) Int. Cl.
| | | |
|---|---|---|
| *H03F 1/02* | (2006.01) | |
| *H03F 3/24* | (2006.01) | |
| *H04B 1/04* | (2006.01) | |
| *H04L 27/12* | (2006.01) | |

(52) U.S. Cl.
CPC ............ *H03F 3/245* (2013.01); *H03F 1/0233* (2013.01); *H04B 1/04* (2013.01); *H04L 27/12* (2013.01); *H03F 2200/105* (2013.01); *H03F 2200/451* (2013.01); *H04B 2001/0408* (2013.01)

(58) Field of Classification Search
CPC ..... H03F 1/02; H03F 1/26; H03F 1/32; H03F 1/0233; H03F 3/19; H03F 3/21; H03F 3/24; H03F 3/68; H03F 3/195; H03G 3/00; H03G 3/30; H03G 11/00; H04B 1/02; H04B 1/04; H04B 1/10; H04B 1/66; H04L 27/00; H04L 27/12
USPC ......... 330/127, 136, 295; 375/303; 455/101, 455/102, 127.3, 552.1
See application file for complete search history.

(56) References Cited

U.S. PATENT DOCUMENTS

| | | |
|---|---|---|
| 5,304,146 A | 4/1994 | Welland |
| 5,852,384 A | 12/1998 | Sakakura et al. |
| 7,265,623 B2 | 9/2007 | Bhattacharjee |
| 7,405,632 B2 | 7/2008 | Kishino |
| 8,634,782 B2 * | 1/2014 | Asuri .................. H04B 1/0483 455/552.1 |
| 9,276,547 B2 | 3/2016 | Wang |
| 10,211,786 B2 | 2/2019 | Wang et al. |

(Continued)

OTHER PUBLICATIONS

WiSUN Alliance, "White Paper Comparing IOT Networks At A Glance; How WiSUN FAN stacks up against LoRaWAN and NB-IoT," 2019, 12 pages total.

(Continued)

*Primary Examiner* — Shawkat M Ali
(74) *Attorney, Agent, or Firm* — Trop, Pruner & Hu, P.C.

(57) ABSTRACT

In one embodiment, a dual-mode power amplifier that can operate in different modes includes: a first pair of metal oxide semiconductor field effect transistors (MOSFETs) to receive and pass a constant envelope signal; a second pair of MOSFETs to receive and pass a variable envelope signal, where first terminals of the first pair of MOSFETs are coupled to first terminals of the second pair of MOSFETs, and second terminals of the first pair of MOSFETs are coupled to. second terminals of the second pair of MOSFETs; and a shared MOSFET stack coupled to the first pair of MOSFETs and the second pair of MOSFETs.

16 Claims, 6 Drawing Sheets

(56) References Cited

U.S. PATENT DOCUMENTS

| | | |
|---|---|---|
| 10,338,646 B1 | 7/2019 | Vilhonen et al. |
| 10,637,404 B2 | 4/2020 | Haine et al. |
| 10,833,795 B2 | 11/2020 | Hoyer et al. |
| 11,025,231 B1 | 6/2021 | Sun et al. |
| 2004/0183606 A1 | 9/2004 | Komurasaki |
| 2012/0249270 A1 | 10/2012 | Li et al. |
| 2012/0286889 A1 | 11/2012 | Park |
| 2014/0335805 A1* | 11/2014 | Briffa .................... H03F 1/0211 455/127.3 |
| 2020/0066126 A1 | 2/2020 | Voor et al. |

OTHER PUBLICATIONS

W.H. Doherty, "A New High Efficiency Power Amplifier For Modulated Waves," May 1936, 25 pages total.

Ercan Kaymaksut, et al., "CMOS Transformer-Based Uneven Doherty Power Amplifier for WLAN Applications," 2011, 4 pages total.

Song Hu, et al., "28/37/39 GHz Multiband Linear Doherty Power Amplifier in Silicon for 5G Applications," 2019, 12 pages total.

Ercan Kaymaksut, et al., "Transformer-Based Uneven Doherty Power Amplifier in 90 nm CMOS for WLAN Applications," IEEE Journal of Solid-State Circuits, vol. 47, No. 7, Jul. 2012, 13 pages total.

U.S. Appl. No. 17/240,226, filed Apr. 26, 2021, entitled "Providing A Programmable Inductor To Enable Wide Tuning Range," by Ruifeng Sun et al.

U.S. Appl. No. 16/904,821, filed Jun. 18, 2020, entitled "Low Power, Efficient Doherty Power Amplifier," by Mustafa Koroglu et al.

\* cited by examiner

DUAL-MODE POWER AMPLIFIER FOR WIRELESS COMMUNICATION

BACKGROUND

Modern wireless communication systems often are tasked to support multiple modulation schemes. For modulation in which a signal has a constant envelope, such as in frequency modulation (FM in analog form or frequency shift keying (FSK) in digital form), a switching mode power amplifier (PA) is typically used due to better efficiency. For modulation in which signal envelope varies, such as in orthogonal frequency division multiplexing (OFDM), a linear mode PA is typically used to meet performance requirements (e.g., error vector magnitude (EVM), spectral emission mask (SEM)).

As such, typical wireless devices include separate PAs that are configured for these different modes of operation. But in so doing, additional chip real estate, power consumption, and complexity of operation (including switching between these devices) is incurred.

SUMMARY OF THE INVENTION

In one aspect, a transmitter includes: a first power amplifier to amplify a first signal of a first modulation scheme; a second power amplifier to amplify a second signal of a second modulation scheme; and an energy storage device having a first node coupled to an output node of the first power amplifier and a second node directly coupled to a shared output node, where an output node of the second power amplifier is directly coupled to the shared output node.

In an example, the first power amplifier and the second power amplifier are AC coupled. The first power amplifier may be configured for linear mode operation and the second power amplifier may be configured for switching mode operation. The first power amplifier is to receive the first signal of the first modulation scheme comprising a variable envelope modulation scheme, and the second power amplifier is to receive the second signal of the second modulation scheme comprising a constant envelope modulation scheme.

In an example, the first power amplifier, the second power amplifier, and the energy storage device are adapted on a single semiconductor die. The common output node is coupled to an off-chip matching network, the off-chip matching network coupled to an antenna to radiate the first signal and the second signal. As an example, the energy storage device comprises a capacitor. The first power amplifier comprises a first cascoded transistor stack and the second power amplifier comprises a second cascoded transistor stack.

In another aspect, a dual-mode power amplifier comprises: a first pair of metal oxide semiconductor field effect transistors (MOSFETs) to receive and pass a constant envelope signal; a second pair of MOSFETs to receive and pass a variable envelope signal, where first terminals of the first pair of MOSFETs are coupled to first terminals of the second pair of MOSFETs, and second terminals of the first pair of MOSFETs are coupled to second terminals of the second pair of MOSFETs; and a shared MOSFET stack coupled to the first pair of MOSFETs and the second pair of MOSFETs.

In an example, the shared MOSFET stack comprises a first plurality of MOSFETs of a first polarity coupled between a supply voltage node and an output node and a second plurality of MOSFETs of a second polarity coupled between a reference voltage node and the output node. The shared MOSFET stack comprises a first enable MOSFET and a second enable MOSFET, where the first enable MOSFET is coupled to the supply voltage node and the second enable MOSFET is coupled to the reference voltage node. The shared MOSFET stack further comprises a first output MOSFET and a second output MOSFET, where the first output MOSFET is coupled to a first one of the first pair of MOSFETs and a first one of the second pair of MOSFETs, and the second output MOSFET is coupled to a second one of the first pair of MOSFETs and a second one of the second pair of MOSFETs.

In an example, the first pair of MOSFETs is to receive the constant envelope signal via a first buffer coupled to a first capacitor coupled to a first one of the first pair of MOSFETs and a second buffer coupled to a second capacitor coupled to a second one of the first pair of MOSFETs. The second pair of MOSFETs is to receive the variable envelope signal via a third capacitor coupled to a first one of the second pair of MOSFETs and a fourth capacitor coupled to a second one of the second pair of MOSFETs.

In yet another aspect, a dual-mode power amplifier comprises: a transistor stack comprising a first plurality of MOSFETs of a first polarity and a second plurality of MOSFETs of a second polarity; a first buffer pair to receive a variable envelope signal of a first modulation scheme and provide the variable envelope signal to a first MOSFET of the first plurality of MOSFETs and a first MOSFET of the second plurality of MOSFETs; and a second buffer pair to receive a constant envelope signal of a second modulation scheme and provide the constant envelope signal to the first MOSFET of the first plurality of MOSFETs and the first MOSFET of the second plurality of MOSFETs.

In an example, the dual-mode power amplifier further comprises: a first coupling capacitor coupled between a first buffer of the first buffer pair and the first MOSFET of the first plurality of MOSFETs; and a second coupling capacitor coupled between a second buffer of the first buffer pair and the first MOSFET of the second plurality of MOSFETs.

In an example, the transistor stack comprises: a second MOSFET of the first plurality of MOSFETs coupled to the first MOSFET of the first plurality of MOSFETs, where a first terminal of the second MOSFET of the first plurality of MOSFETs is coupled to an output node of the dual-mode power amplifier; and a second MOSFET of the second plurality of MOSFETs coupled to the first MOSFET of the second plurality of MOSFETs, where a first terminal of the second MOSFET of the second plurality of MOSFETs is coupled to the output node.

A bias circuit may be configured to: provide a first bias voltage to the second MOSFET of the first plurality of MOSFETs when operation is according to the first modulation scheme, to minimize switching resistance of the second MOSFET of the first plurality of MOSFETs; and provide a second bias voltage to the second MOSFET of the second plurality of MOSFETs when the operation is according to the second modulation scheme, to bias the second MOSFET of the second plurality of MOSFETs at a minimal gate voltage to maintain device reliability.

In an example, the dual-mode power amplifier further comprises a controller to control the dual-mode power amplifier to operate in a linear mode to output the variable envelope signal and to operate in a switching mode to output the constant envelope signal. The controller may control the bias circuit to provide a first bias voltage to the second MOSFET of the first plurality of MOSFETs in the linear mode and provide a second bias voltage to the second MOSFET of the first plurality of MOSFETs in the switching mode, the first bias voltage different than the second bias voltage.

DETAILED DESCRIPTION OF ILLUSTRATIVE EMBODIMENTS

In various embodiments, a transmitter may be configured with one or more power amplifiers (PAs) that can be operated in both a linear mode and a switching mode. In one embodiment, two separate PAs are used. By using an AC-coupled connection between outputs of these two PAs, a better trade-off may be realized to achieve optimum matching conditions for each PA. In other embodiments, a single dual-mode PA is used, which can be configured to operate either in linear or switching modes. In such embodiment, by sharing at least some circuitry of the PA (such as output driving transistors), smaller die area is realized.

In many wireless communication systems, multiple modulation schemes are used for various reasons. One example is a wireless smart utility network (SUN) as defined in IEEE 802.15.4g. In this use case, three modulations are used: FSK, offset-quadrature phase shift keying (O-QPSK), and OFDM. For such applications, different PA requirements exist.

In turn, PA architecture heavily depends on the modulation being supported. For modulation in which signal envelope is kept constant such as FSK, a switching mode PA is desired due to its high efficiency, which can directly impact system energy consumption and cost, and particularly so for low power Internet of Things (IoT) systems. On the other hand, for modulation in which signal envelope varies over time such as OFDM, a linear mode PA is desired since the output is to faithfully track the input waveform, otherwise system performance, such as EVM and SEM, will be sacrificed.

One straightforward way to implement a dual-mode PA is to have two separate PAs: one PA optimized for switching-mode operation, and the other PA optimized for linear-mode operation. In this arrangement, the outputs of the PAs may be coupled in parallel. However in such an implementation, each PA may require a different optimum matched impedance. In addition, since two PAs are directly connected together, an output impedance of one PA directly affects a load impedance seen by the other PA. While these issues may be compensated by including impedance matching stages at the outputs of the PAs, complexity is raised. For example, careful considerations have to be taken into account because these additional matching networks imply more complexity, more loss and additional cost.

Figure 1:
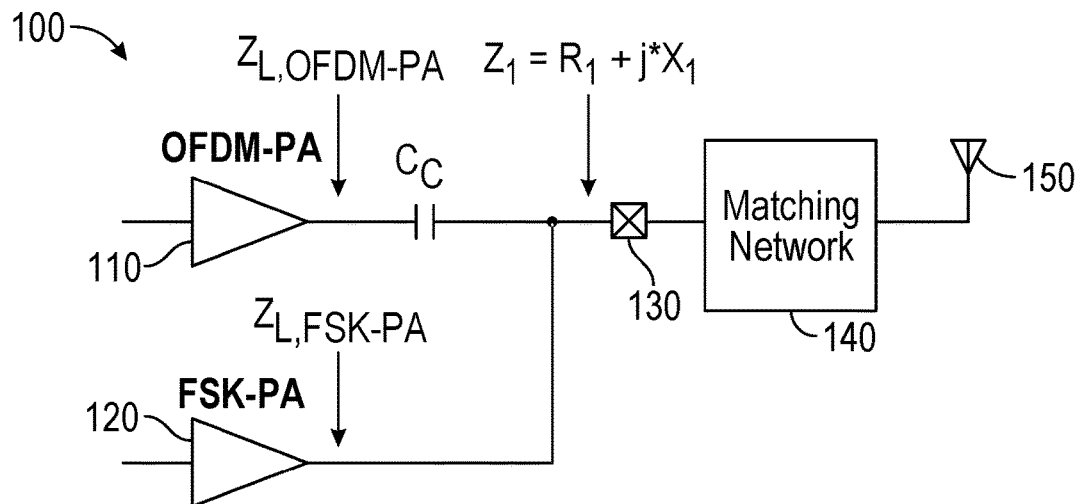
FIG. 1 is a block diagram of a transmitter in accordance with an embodiment.

In one embodiment, separate PAs may be provided with an AC coupling between the PAs. Referring now to FIG. 1, shown is a block diagram of a transmitter in accordance with an embodiment. As shown in FIG. 1, transmitter 100 includes multiple separate power amplifiers (PAs), namely a first PA 110 and a second PA 120. In the embodiment shown, first PA 110 may be implemented as a linear mode PA for use in connection with various modulation schemes that provide for a variable envelope signal. As an example, one such variable envelope modulation scheme is OFDM. In contrast, second amplifier PA 120 may be implemented as a switching mode PA for use in connection with various modulation schemes that provide for a constant envelope signal. As an example, one such constant envelope modulation scheme is FSK.

To provide an impendence transformation, a coupling capacitor Cc is directly coupled between an output of first PA 110 and an output node 130. In an example where PAs 110 and 120 are configured on a single semiconductor die, output node 130 may be an output pad of the die. In turn, output node 130 couples to a matching network 140, in turn coupled to an antenna 150.

Thus in contrast to an implementation in which two PA outputs are directly connected (hence named "DC-coupled" since they share the same DC potential), circuit 100 provides an AC-coupled configuration. As shown in FIG. 1, the load impedance seen by PA 110 and PA 120 are given by:

$$Z\_(L, \text{OFDM-PA}) = Z\_(C\_c) + (Z\_1 \| Z\_(O, \text{FSK-PA})) \quad \text{Equation (1)}$$

$$Z\_(L, \text{FSK-PA}) = Z\_1 \| (Z\_(C\_c) + Z\_(O, \text{OFDM-PA})) \quad \text{Equation (2)}$$

In Equations (1) and (2), Z1 is the impedance looking toward antenna at the common node, $Z_{CC}$ is the impedance of the capacitor (i.e., $1/(j\pi C)$), ZO,FSK-PA is the output impedance of FSK-PA looking toward its output node, and ZO,OFDM-PA is the output impedance of OFDM-PA looking toward its output node. In an embodiment, the capacitance value of "Cc" is chosen such that an optimum impedance exists for both PAs simultaneously. Note that capacitor "Cc" can possibly be present in PA 120 if, for instance, the optimum load impedance of PA 120 requires a more negative imaginary part compared to that of PA 110. In some embodiments, a capacitor may be more suitable, as compared to an inductor, because the loss of a capacitor is usually lower than an inductor and the area occupied is smaller, especially for an on-chip implementation (or perhaps at least at lower frequencies). However, an inductor can still be used in embodiments.

Figure 2:
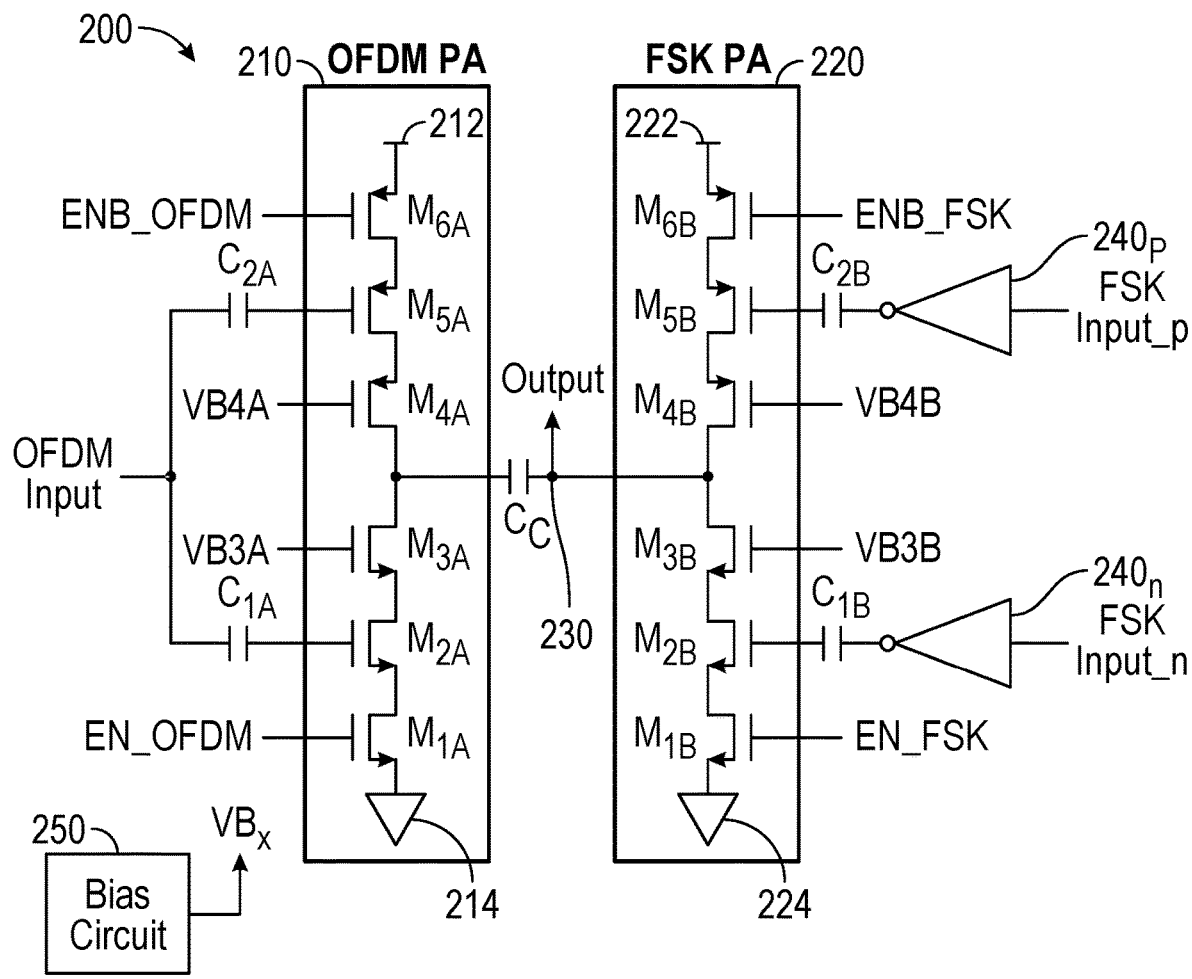
FIG. 2 is a schematic diagram of a dual-mode PA in accordance with an embodiment.

Although implementing a dual-mode PA using two separate PAs is simple, one drawback is the excess die area due to the large size of the output driving transistors, as shown in FIG. 2, which is a schematic diagram of a dual-mode PA in accordance with an embodiment. In the embodiment of FIG. 2, dual-mode PA 200 has separate power amplifiers, namely a first PA stage 210 and a second PA stage 220. As with the discussion above, first PA 210 may be configured as a linear mode PA (for, e.g., OFDM modulation), while second PA 220 may be configured as a switching mode PA (for, e.g., FSK modulation).

With reference to first PA 210, a transistor stack is provided and is coupled between a supply voltage node 212 and a reference voltage node 214. Specifically as shown in the implementation of FIG. 2, the transistor stack is formed of a plurality of cascoded MOSFETs, including a plurality of P-channel MOSFETs (PMOS) devices $M_{4A-6A}$ that couple between supply voltage node 212 and an output node 230 via a coupling capacitor Cc. The cascoded transistor stack further includes a plurality of N-channel MOSFETs (NMOS) devices $M_{1A\text{-}3A}$ that couple between reference voltage node 214 and output node 230 via coupling capacitor Cc.

As further shown, an incoming OFDM signal to be transmitted is coupled by way of separate capacitors $C_{2A,1A}$ to input transistors, namely MOSFETs $M_{5A}$ and $M_{2A}$ that pass the signal. In this arrangement, MOSFETs $M_{1A, 6A}$ may be configured as enable transistors. When valid incoming signals are received in first PA 210, active enable signals (EN_OFDM, ENB_OFDM) may be provided to the gate terminals of enable MOSFETs $M_{6A,1A}$ and similarly, when there is no active signal here, these transistors may be disabled to reduce power consumption. First PA 210 further includes output transistors, namely MOSFETs $M_{4A,3A}$, which receive the incoming signal by way of coupling to input MOSFETs $M_{5A,2A}$. As seen, these output MOSFETs are gated by bias signals VB4A, VB3A. In an embodiment, these bias signals are provided by a bias circuit 250. As will be described herein, bias circuit 250 may be controlled to provide appropriate bias signals to various MOSFETs of PAs 210, 220.

Thus when OFDM or other variable envelope signals are being transmitted and first PA 210 is active, the incoming signals are passed through the transistor stack of first PA 210 and are output to output node 230 via coupling capacitor Cc. Note that while shown with this particular implementation, it is equally possible for this coupling capacitor to instead couple on the other side of output node 230.

With reference now to second PA 220, a similar transistor stack couples between a supply voltage node 222 and a reference voltage node 224. The same number of MOSFETS (having the same reference numerals, except of the "B" letters) are present as in first PA 210. Note further here presence of AC-coupling capacitors C2B, C1B that receive incoming FSK signals from input buffers 240p,n that receive the FSK signal.

Depending on the output power level, M1A-M6A and M1B-M6B can be very large and consume most of the area of the entire PA. Two transistors of the stack, the bottom (top) transistor, M1A or M1B (M6A or M6B), are used as enable-disable switches. Note that although they function as switches, their gate voltages (EN_FSK, ENB_FSK, EN_OFDM, ENB_OFDM) are not necessarily ground or VDD as in case of a digital logic gate. In one example, when enabled, their voltage levels may be selected for device reliability, or in another example, the gate voltages may be set up by a current mirror (e.g., diode-connected NMOS or PMOS devices) as they will be used as a current source. The top (bottom) transistors, M3A or M3B (M4A or M4B), are used as protection devices because the voltage swing at PA output is usually large.

Note that in FIG. 2, the incoming FSK signal is split before AC-coupling capacitors C2B, C1B, while the ODFM signal is only separated after AC-coupling capacitors C2A, C1A. This is done to satisfy different signal conditioning requirements. Because the function of M1A and M1B (M6A and M6B) is same, so is that of M3A and M3B (M4A and M4B), they can be reused in both PA modes, although their gate biasing levels may need to be adjusted accordingly.

Figure 3:
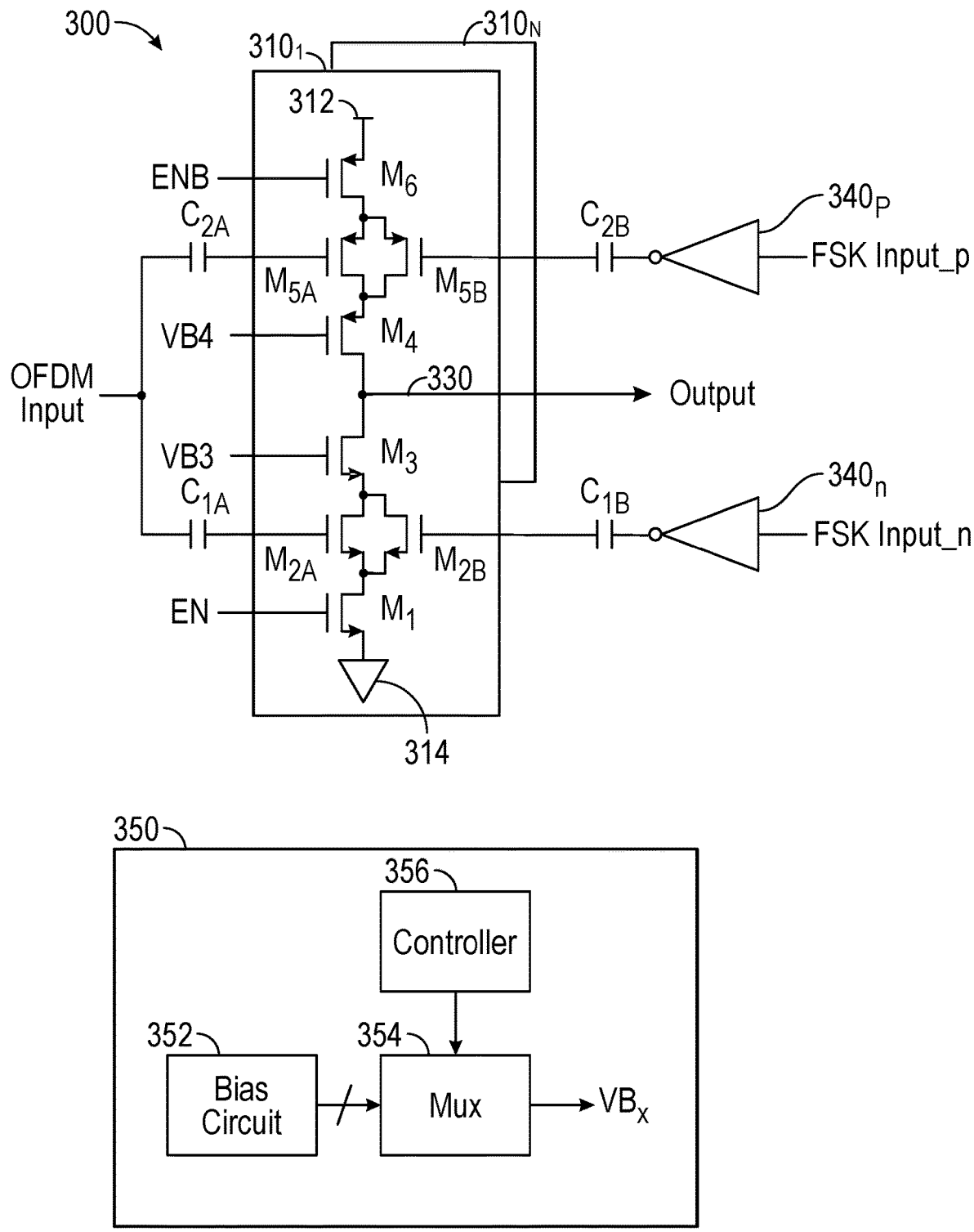
FIG. 3 is a schematic diagram of a dual-mode PA in accordance with another embodiment.

Thus in other cases, a dual-mode PA may be realized in which at least some shared transistors are used, to reduce chip area, complexity and power consumption. Referring now to FIG. 3, shown is a schematic diagram of a dual-mode PA in accordance with another embodiment. In the embodiment of FIG. 3, a dual-mode PA 300 has a plurality of slices $310_1\text{-}310_N$, also referred to as transistors stacks. Depending on a desired power level, a controller may controllably select one, a subset, or all slices to be enabled.

As shown, transistor stack 310 has partially shared driving transistors that couple between a supply voltage node 312 and a reference voltage node 314. In this embodiment, variable envelope signals such as OFDM signals may couple to gate terminals of input transistors $M_{5A,2A}$. Constant envelope signals such as FSK signals instead couple to gate terminals of input transistors $M_{5B,2B}$. In other aspects, the transistor stack may generally be the same as discussed above in FIG. 2, with enable transistors $M_{1,6}$ and output transistors $M_{3,4}$. Given the similarity, the common components are not further discussed, and understand that reference numerals used in FIG. 3 generally refer to the same components as in FIG. 2, albeit of the "300" series in place of the "200" series of FIG. 2.

In the implementation of FIG. 3, input transistors M2A/M2B and M5A/M5B cannot be shared because their input signals are connected in different ways. As a result, there is still some area overhead. On top of this, the biasing of input transistors may be complicated, because the unused input transistors (M2A and M5A in FSK mode, M2B and M5B in OFDM mode), remain off, but their gate voltages have to be chosen carefully to not compromise device reliability.

As further shown in FIG. 3, details of a programmable bias system 350 are illustrated. A bias circuit 352 may include circuitry to generate multiple bias voltages. For example, bias circuit 352 may include one or more of current mirrors, current digital-to-analog converters (DACs), and resistor networks/DACs to generate multiple bias voltages. As shown bias circuit 352 outputs the bias voltages to a multiplexer 354. Multiplexer 354 may be controlled to output one or more bias voltages that are provided to one or more MOSFETs of a transistor stack.

In turn, a controller 356 may control multiplexer 354 based at least in part on modulation scheme, desired output power level and so forth to output specific bias voltages. In one embodiment, controller 356 may include either dedicated or programmable hardware circuitry configured to control generation of bias signals, among other functions, such as configuring circuitry of a dual-mode PA as described herein. To this end, controller 356 may include or be coupled to a non-volatile storage or other non-transitory storage medium to store instructions and data usable for bias signal generation as described herein.

Although shown with this particular implementation, understand that variations and alternatives are possible. For example, controller 356 may be a separate component, and can be an overall controller of a transmitter, in some cases. And for ease of discussion herein, note that use of the term "bias circuit" may be used to more generally refer to all the components of a programmable bias system such as shown in FIG. 3.

Figure 4:
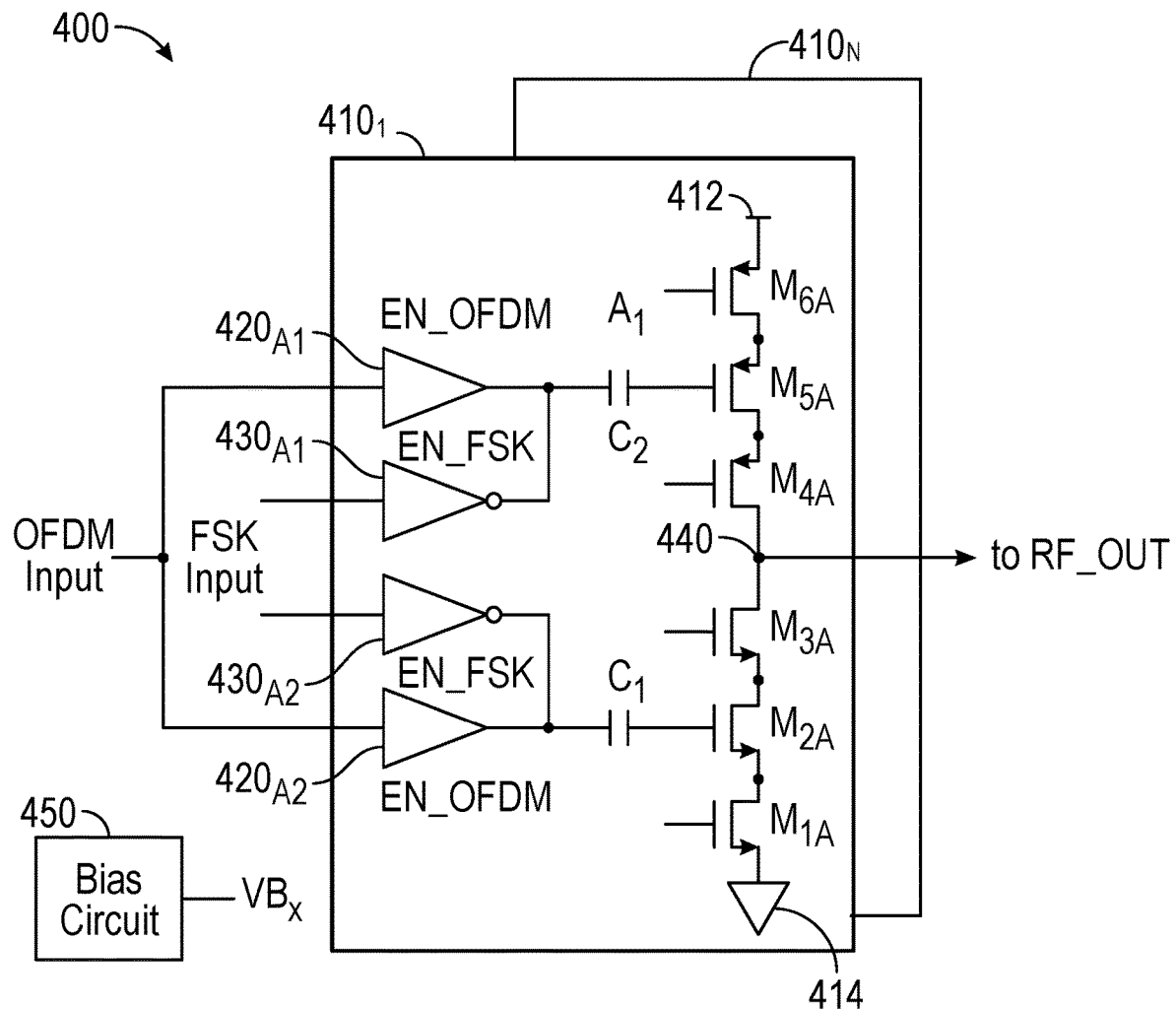
FIG. 4 is a schematic diagram of a dual-mode PA in accordance with a still further embodiment.

In yet another embodiment, a dual-mode PA with fully shared driving transistors is possible. Referring now to FIG. 4, shown is a schematic diagram of a dual-mode PA in accordance with a still further embodiment. In the embodiment of FIG. 4, note that all transistors of the transistor stack are shared to accommodate incoming constant envelope signals and variable envelope signals. Given the similarity with the implementation of FIG. 3, the common components are not further discussed, and understand that reference numerals used in FIG. 4 generally refer to the same components as in FIG. 4, albeit of the "400" series in place of the "300" series of FIG. 3. In FIG. 4, note that buffers $420_{A1,A2}$ are provided for the OFDM signals.

In this implementation, all driving transistors are shared between FSK and OFDM modes, thus area savings are maximized. Again, to ensure that PA 400 is operating in the desired mode (switching or linear), the biasing voltages are to be adjusted properly. In switching-mode operation, transistors M2 and M5 are used as a switch, thus the switch resistance, which depends on the gate voltage, should be minimized to maximize efficiency. On the other hand, in linear-mode operation, transistors M2 and M5 are used as a linear amplifying device, and the biasing should be set with consideration of device linearity in mind. In a particular embodiment, transistors M2 and M5 in FSK or switching mode may be biased such that when they are on, the switch on resistance is minimized (since they are used as switch), where the upper limit is bound by device reliability. On the other hand, when transistors M2 and M5 are used in OFDM or linear mode, gate biasing may be biased at a level such that the linearity of the transistors are maximized to minimize non-linear distortion. In turn, transistors M3 and M4 may have their gate voltages (biasing levels) controlled to be different in OFDM and FSK modes.

Besides area savings, the embodiment of FIG. 4 does not require independent interfaces for the switching and linear PAs, thus potentially saving package pins, circuit board area and external components, and creates advantages in cost and ease of use. Understand while shown at this high level in the embodiment of FIG. 4, many variations and alternatives are possible.

Figure 5:
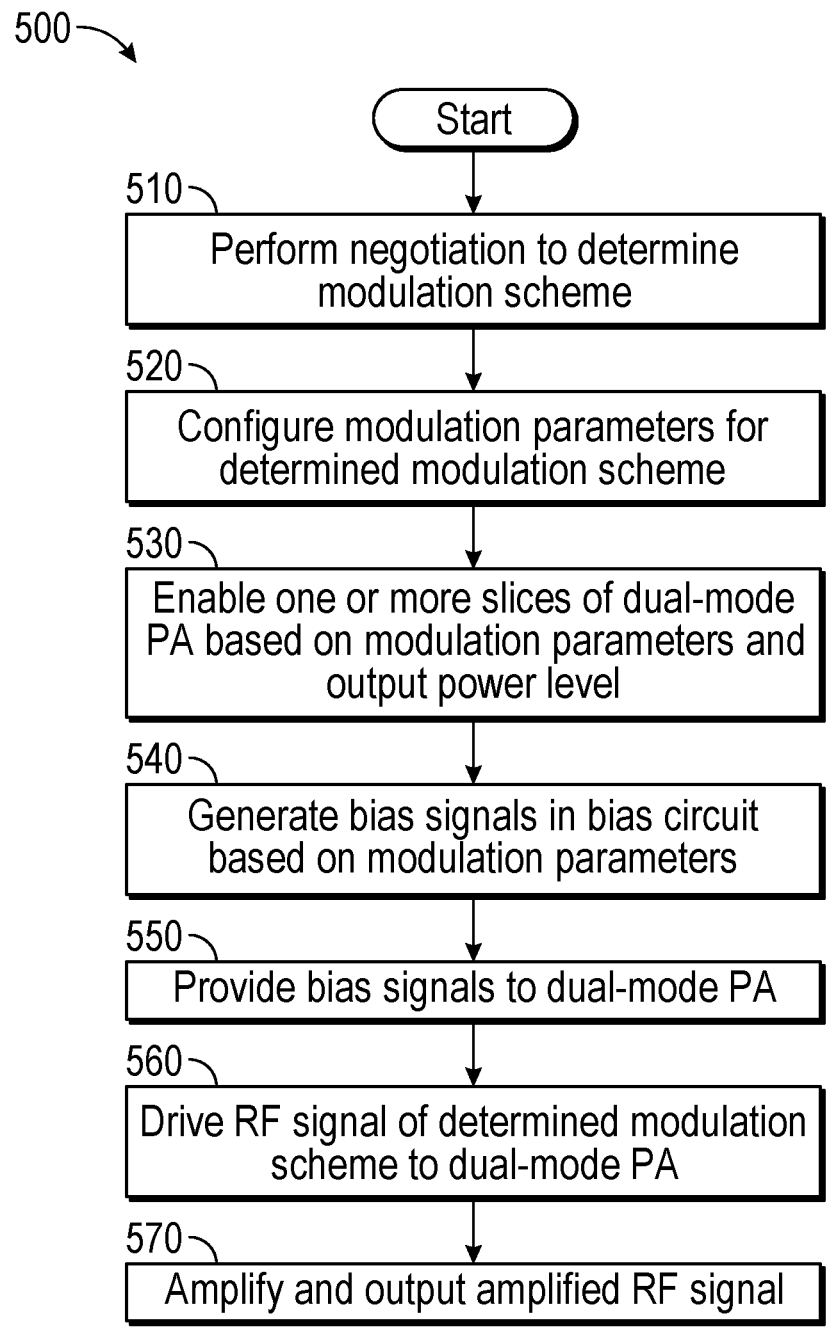
FIG. 5 is a flow diagram of a method in accordance with an embodiment.

Referring now to FIG. 5, shown is a flow diagram of a method in accordance with an embodiment. More specifically as shown in FIG. 5, method 500 is a method for configuring a dual mode PA for operation in a particular mode. In embodiments, method 500 may be performed by hardware circuitry, such as a controller of a radio that configures various components of the radio including a PA as described herein.

As shown, method 500 begins by performing a negotiation to determine a modulation scheme (block 510). Understand that this negotiation may be performed by two devices in wireless communication and may be based on a given negotiation protocol in which capabilities of the devices can be identified. During this negotiation, a given modulation scheme may be determined. For purposes of discussion herein, assume that the modulation scheme is a given one of a FSK or OFDM modulation scheme. Next at block 520 modulation parameters may be configured for the determined modulation scheme. Such modulation parameters may include a type of encoding, data rates and so forth. Control next passes to block 530 where one or more slices of the dual-mode PA may be enabled. In embodiments, this enabling of given slices may be based on the modulation parameters as well as an output power level. For example, it is possible for more slices to be enabled to output a RF signal at higher power levels, and vice versa.

Still referring to FIG. 5, next at block 540 bias signals may be generated in a bias circuit based on the modulation parameters. Understand that these bias signals may be used to appropriately bias various transistors of the dual-mode PA, such as driving transistors, enable transistors and so forth. The bias signals may then be provided to the PA (block 550).

Thus when appropriately biased, an RF signal of the determined modulation scheme may be driven to the dual-mode PA (block 560). For example, the RF signal may be driven to gate terminals of input MOSFETs of the PA. This RF signal is amplified and is output from the PA (at block 570). Understand that the amplified RF signal may be radiated via an antenna to which the PA is coupled to enable communication to a target.

Figure 6:
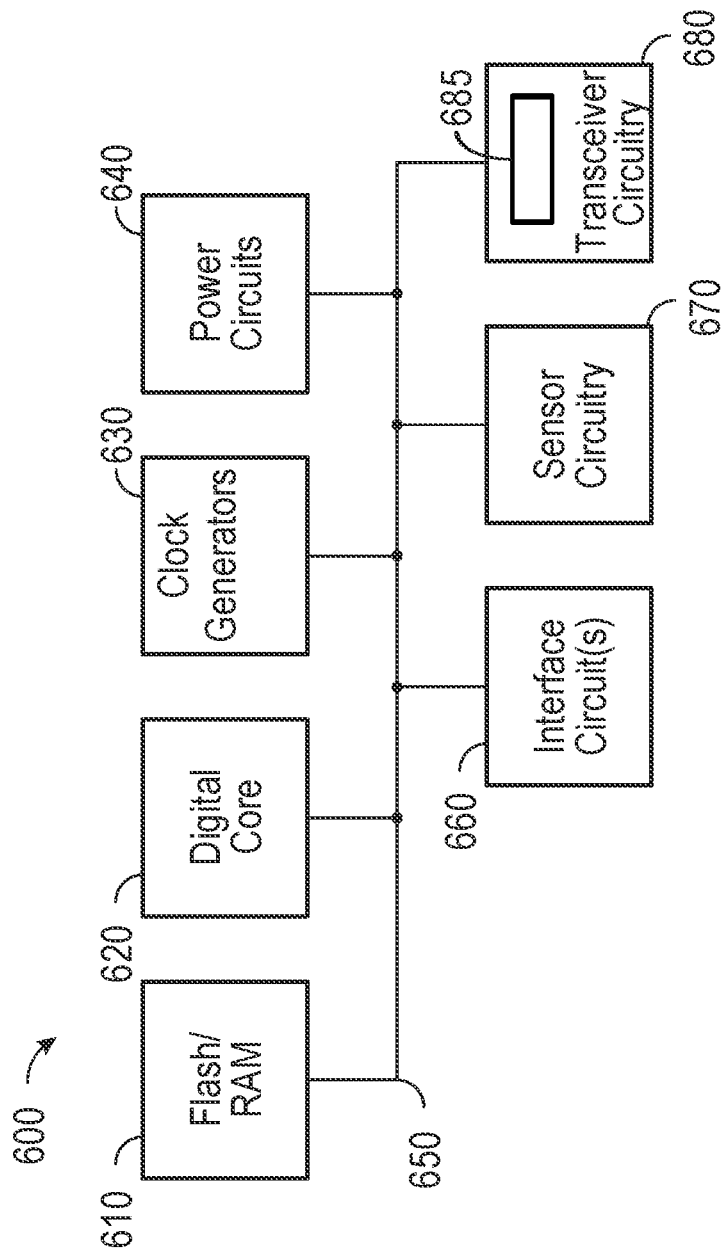
FIG. 6 is a block diagram of a representative integrated circuit that incorporates an embodiment.

Referring now to FIG. 6, shown is a block diagram of a representative integrated circuit 600 that includes multi-mode power amplifier circuitry as described herein. In the embodiment shown in FIG. 6, integrated circuit 600 may be, e.g., a microcontroller, wireless transceiver that may operate according to one or more wireless protocols (e.g., WLAN-OFDM, WLAN-DSSS, Bluetooth, among others), or other device that can be used in a variety of use cases, including sensing, metering, monitoring, embedded applications, communications, applications and so forth, and which may be particularly adapted for use in an IoT device.

In the embodiment shown, integrated circuit 600 includes a memory system 610 which in an embodiment may include a non-volatile memory such as a flash memory and volatile storage, such as RAM. In an embodiment, this non-volatile memory may be implemented as a non-transitory storage medium that can store instructions and data. Such non-volatile memory may store instructions, including instructions for determining appropriate configuration of a PA in accordance with an embodiment for a given mode of operation and control of bias signals for the PA, as described herein.

Memory system 610 couples via a bus 650 to a digital core 620, which may include one or more cores and/or microcontrollers that act as a main processing unit of the integrated circuit. In turn, digital core 620 may couple to clock generators 630 which may provide one or more phase locked loops or other clock generator circuitry to generate various clocks for use by circuitry of the IC.

As further illustrated, IC 600 further includes power circuitry 640, which may include one or more voltage regulators. Additional circuitry may optionally be present depending on particular implementation to provide various functionality and interaction with external devices. Such circuitry may include interface circuitry 660 which may provide interface with various off-chip devices, sensor circuitry 670 which may include various on-chip sensors including digital and analog sensors to sense desired signals, such as for a metering application or so forth.

In addition as shown in FIG. 6, transceiver circuitry 680 may be provided to enable transmission and receipt of wireless signals, e.g., according to one or more of a local area or wide area wireless communication scheme, such as Zigbee, Bluetooth, IEEE 802.11, IEEE 802.15.4, cellular communication or so forth. As shown, transceiver circuitry 680 includes a PA 685 that may include shared circuitry to be used for communicating signals of multiple modulation schemes in multiple modes including linear and switching modes as described herein. Understand while shown with this high level view, many variations and alternatives are possible.

Note that ICs such as described herein may be implemented in a variety of different devices such as an IoT device. This IoT device may be, as two examples, a smart bulb of a home or industrial automation network or a smart utility meter for use in a smart utility network, e.g., a mesh network in which communication is according to an IEEE 802.15.4 specification or other such wireless protocol.

Figure 7:
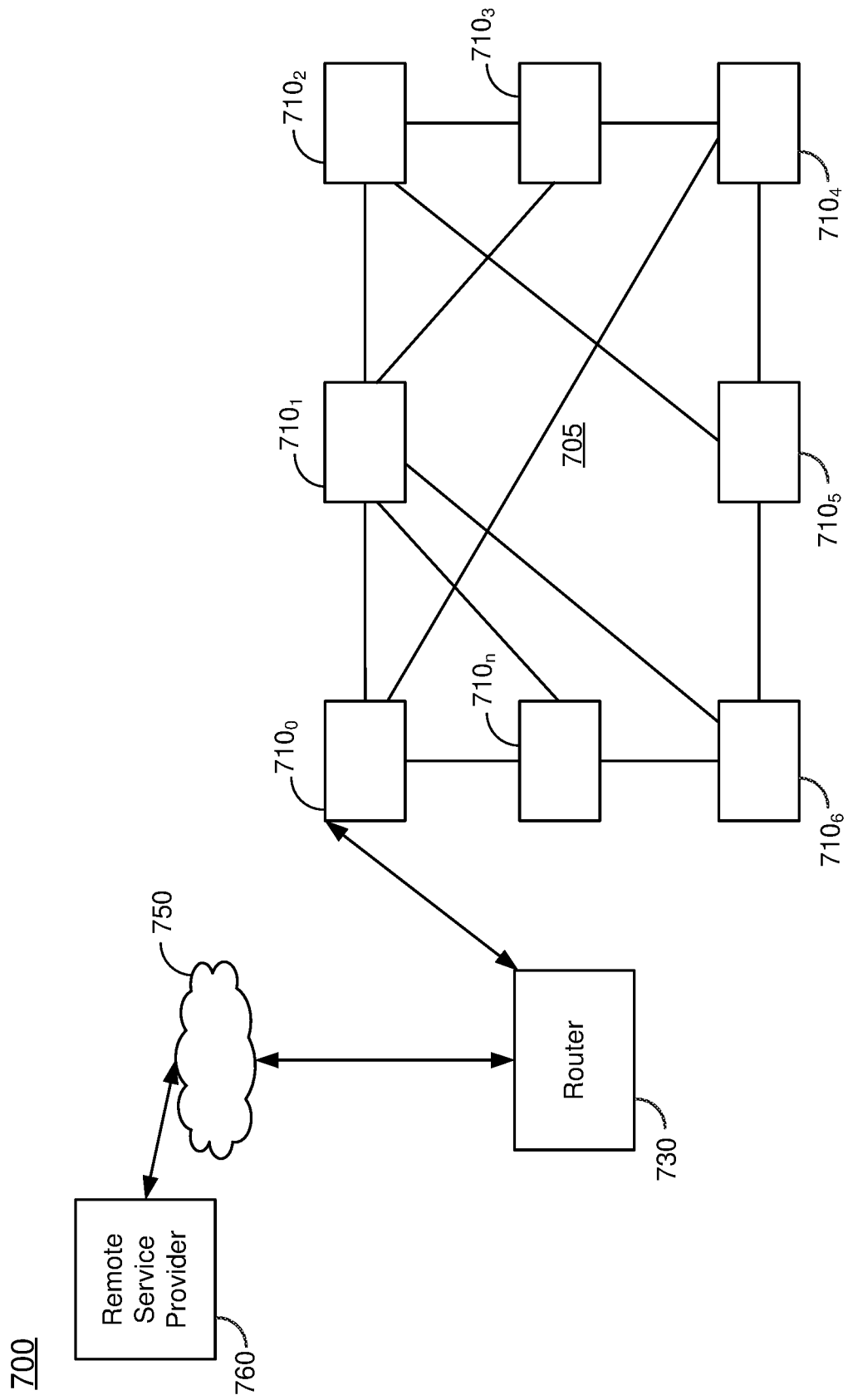
FIG. 7 is a high level diagram of a network in accordance with an embodiment.

Referring now to FIG. 7, shown is a high level diagram of a network in accordance with an embodiment. As shown in FIG. 7, a network 700 includes a variety of devices, including smart devices such as IoT devices, routers and remote service providers. In the embodiment of FIG. 7, a mesh network 705 may be present, e.g., in a building having multiple IoT devices $710_{0-n}$. Such IoT devices may include multi-mode PAs as described herein. As shown, at least one IoT device 710 couples to a router 730 that in turn communicates with a remote service provider 760 via a wide area network 750, e.g., the internet. In an embodiment, remote service provider 760 may be a backend server of a utility that handles communication with IoT devices 710. Understand while shown at this high level in the embodiment of FIG. 7, many variations and alternatives are possible.

While the present disclosure has been described with respect to a limited number of implementations, those skilled in the art, having the benefit of this disclosure, will appreciate numerous modifications and variations therefrom. It is intended that the appended claims cover all such modifications and variations.

What is claimed is:

1. A transmitter comprising:
a first power amplifier configured for linear mode operation to amplify a first signal of a first modulation scheme comprising a variable envelope modulation scheme;
a second power amplifier configured for switching mode operation to amplify a second signal of a second modulation scheme comprising a constant envelope modulation scheme; and
an energy storage device having a first node coupled to an output of the first power amplifier and a second node directly coupled to a shared output node, wherein an output of the second power amplifier is directly coupled to the shared output node, and wherein the output of the first power amplifier and the output of the second power amplifier are alternating current (AC) coupled.

2. The transmitter of claim 1, further comprising a single semiconductor die on which the first power amplifier, the second power amplifier, and the energy storage device are adapted.

3. The transmitter of claim 2, wherein the shared output node is coupled to an off-chip matching network, the off-chip matching network coupled to an antenna to radiate the first signal and the second signal.

4. The transmitter of claim 2, wherein the shared output node comprises an output pad of the single semiconductor die.

5. The transmitter of claim 1, wherein the energy storage device comprises a capacitor.

6. The transmitter of claim 1, wherein:
the first power amplifier comprises a first cascoded transistor stack; and
the second power amplifier comprises a second cascoded transistor stack.

7. The transmitter of claim 6, wherein the first cascoded transistor stack comprises a first pair of metal oxide semiconductor field effect transistors (MOSFETs) to receive and pass the first signal comprising a variable envelope signal.

8. The transmitter of claim 7, wherein the first cascoded transistor stack further comprises a second pair of MOSFETs to output the variable envelope signal.

9. The transmitter of claim 8, wherein the first cascoded transistor stack further comprises a third pair of MOSFETs to switchably enable the first power amplifier.

10. The transmitter of claim 7, wherein the second cascoded transistor stack comprises another pair of MOSFETs to receive and pass the second signal comprising a constant envelope signal.

11. The transmitter of claim 1, wherein at least some circuitry of the first power amplifier and the second power amplifier are to be shared.

12. The transmitter of claim 1, wherein the energy storage device comprises an inductor.

13. The transmitter of claim 1, wherein the energy storage device comprises a capacitor having a capacitance value to simultaneously provide an optimum impedance for the first power amplifier and the second power amplifier.

14. A transmitter comprising:
a semiconductor die comprising:
a linear power amplifier (PA) to amplify a first signal of a first modulation scheme;
a switched mode PA to amplify a second signal of a second modulation scheme;
a capacitor having a first node directly coupled to an output of the linear PA; and
an output pad directly coupled to a second node of the capacitor and coupled to an output of the switched mode PA, wherein the output of the linear PA and the output of the switched mode PA are alternating current (AC) coupled, and wherein the output pad is coupled to a matching network, the matching network separate from the semiconductor die.

15. The transmitter of claim 14, wherein the linear PA is to receive the first signal of the first modulation scheme comprising a variable envelope modulation scheme, and the switched mode PA is to receive the second signal of the second modulation scheme comprising a constant envelope modulation scheme.

16. A transmitter comprising:
a semiconductor die comprising:
an output pad;
a first power amplifier to amplify a first signal of a first modulation scheme comprising a variable envelope modulation scheme, the first power amplifier configured for linear mode operation;
a second power amplifier to amplify a second signal of a second modulation scheme comprising a constant envelope modulation scheme, the second power amplifier configured for switching mode operation; and
a capacitor having a first node coupled to an output of the first power amplifier and a second node directly coupled to the output pad, wherein an output of the second power amplifier is directly coupled to the output pad, and wherein the output of the first power amplifier and the output of the second power amplifier are alternating current (AC) coupled;
a matching network coupled to the output pad; and
an antenna coupled to the matching network.

\* \* \* \* \*